United States Patent
Ikumo et al.

(10) Patent No.: US 8,420,522 B2
(45) Date of Patent: Apr. 16, 2013

(54) SEMICONDUCTOR DEVICE AND MANUFACTURING METHOD OF THE SAME

(75) Inventors: Masamitsu Ikumo, Kawasaki (JP); Hiroyuki Yoda, Kawasaki (JP); Eiji Watanabe, Kawasaki (JP)

(73) Assignee: Fujitsu Semiconductor Limited, Yokohama-shi (JP)

( * ) Notice: Subject to any disclaimer, the term of this patent is extended or adjusted under 35 U.S.C. 154(b) by 505 days.

(21) Appl. No.: 12/213,819

(22) Filed: Jun. 25, 2008

(65) Prior Publication Data

US 2008/0293234 A1 Nov. 27, 2008

Related U.S. Application Data

(62) Division of application No. 11/374,134, filed on Mar. 14, 2006, now Pat. No. 7,417,326.

(30) Foreign Application Priority Data

Dec. 20, 2005 (JP) ................................ 2005-367210

(51) Int. Cl.
*H01L 21/44* (2006.01)

(52) U.S. Cl.
USPC .................. 438/613; 257/E23.021; 257/779; 438/737

(58) Field of Classification Search .......... 438/613–615, 438/737–738; 257/E21.523, E21.021, 734–786, 257/E23.021, E21.214–E21.259
See application file for complete search history.

(56) References Cited

U.S. PATENT DOCUMENTS

| | | | |
|---|---|---|---|
| 5,055,906 A | 10/1991 | Mase et al. | |
| 5,914,536 A | 6/1999 | Shizuki et al. | |
| 6,426,281 B1 | 7/2002 | Lin et al. | |
| 6,426,556 B1 | 7/2002 | Lin | |
| 6,605,524 B1 | 8/2003 | Fan et al. | |
| 6,734,532 B2 | 5/2004 | Koduri et al. | |
| 6,956,292 B2 | 10/2005 | Fan et al. | |
| 6,958,546 B2 | 10/2005 | Fan et al. | |
| 7,008,867 B2 | 3/2006 | Lei | |
| 7,135,770 B2 | 11/2006 | Nishiyama et al. | |

(Continued)

FOREIGN PATENT DOCUMENTS

CN 1437256 A 8/2003
JP 9-191012 7/1997

(Continued)

OTHER PUBLICATIONS

Chinese Office Action dated Apr. 4, 2008 issued in corresponding Application No. 200610073867.5.

(Continued)

*Primary Examiner* — Julio K Maldonado
*Assistant Examiner* — Sonya D McCall Shepard
(74) *Attorney, Agent, or Firm* — Westerman, Hattori, Daniels & Adrian, LLP

(57) ABSTRACT

A semiconductor device includes a plurality of electrode layers provided at designated positions of a semiconductor substrate, an organic insulation film formed on the semiconductor substrate by selectively exposing designated areas of the electrode layers, and projection electrodes for outside connection, the projection electrodes being formed on the designated areas of the electrode layers. Thickness of the organic insulation film situated in the vicinity of the periphery of the projection electrodes is greater than thickness of the organic insulation film situated between the projection electrodes.

5 Claims, 15 Drawing Sheets

U.S. PATENT DOCUMENTS

| | | |
|---|---|---|
| 7,268,438 B2 | 9/2007 | Nishiyama et al. |
| 2002/0093107 A1 | 7/2002 | Wu et al. |
| 2003/0052414 A1* | 3/2003 | Cowens et al. ............... 257/778 |
| 2007/0020912 A1 | 1/2007 | Nishiyama et al. |

FOREIGN PATENT DOCUMENTS

| | | |
|---|---|---|
| JP | 11-274374 A | 10/1999 |
| JP | 2004-63729 A | 2/2004 |
| JP | 2004-200420 | 7/2004 |
| JP | 2004-319892 A | 11/2004 |
| JP | 2005-322735 A | 11/2005 |

OTHER PUBLICATIONS

Korean Office Action dated Jul. 18, 2007 issued in corresponding Application No. 10-2006-0030781.

Japanese Office Action dated May 18, 2010, issued in corresponding Japanese Patent Application No. 2005-367210.

* cited by examiner

RELATED ART

SEMICONDUCTOR DEVICE AND MANUFACTURING METHOD OF THE SAME

CROSS-REFERENCE TO RELATED APPLICATION

This application is a divisional of application Ser. No. 11/374,134, filed Mar. 14, 2006, which is based upon and claims the benefit of priority from the prior Japanese Patent Application No. 2005-367210, filed Dec. 20, 2005, the entire contents of which are incorporated herein by reference.

BACKGROUND OF THE INVENTION

1. Field of the Invention

The present invention generally relates to semiconductor devices and manufacturing methods of the same, and more specifically, to a semiconductor device having a projection electrode (bump) for outside Connection and an organic insulation film and a manufacturing method of the same.

2. Description of the Related Art

Recently, a flip chip connection structure using a projection electrode for outside connection, called a bump, has been widely applied for high density mounting of a package and a semiconductor element.

In a case where solder is selected as a material of such a bump, the bump can be formed by a plating method or a printing method.

A barrier metal layer is formed on the electrode layer by using an electrolytic plating method in order to prevent the solder from being diffused on the semiconductor element, and the soldering bump is formed on the barrier metal layer by a plating method. See Japanese Laid-Open Patent Application Publications No. 2004-200420 and No. 9-191012, for example.

In this case, a surface of the semiconductor element is covered with an organic insulation film such as polyimide for device protection. The surface of the electrode layer is also selectively covered with the organic insulation film.

A manufacturing process of the bump by using the relating art plating method in a manufacturing process of the semiconductor device is shown in FIG. 1.

In a bump forming process by using the related art plating method, first, as shown in FIG. 1-(a), a wiring layer made of silicon (Si) and an electrode layer (electrode pad) 3 are provided on an upper surface, namely a circuit element forming surface, of a semiconductor substrate 1 made of silicon (Si) via an insulation film (insulation layer) made of silicon oxide, for example.

An upper part of the semiconductor substrate 1 including the wiring layer and the electrode layer 3 is covered with an inorganic insulation film (passivation film) 2 made of silicon nitride (SiN) or the like.

In addition, an organic insulation film 4 such as a polyimide resin layer or the like is provided on the inorganic insulation film 2. The organic insulation film 4 is formed for surface protection of the semiconductor element and for easing stress concentrated on a base of the bump 9 when the semiconductor element is mounted on a wiring board 11 (See FIG. 3).

An opening is formed in the inorganic insulation film 2 and the organic insulation film 4 as corresponding to an expected forming position on the electrode layer 3 of the soldering bump 9 so that a pad is exposed.

Illustration of an active element such as a transistor, and a passive element such as resistor element or capacity element formed on the semiconductor substrate 1, an isolation area for insulation-isolating between these elements, an interlayer insulation layer, an inter-element mutual wiring layer, or the like is omitted in FIG. 1.

Next, as shown in FIG. 1-(b), a power supply layer 5 as a plating electrode is formed, by sputtering method, on whole surfaces of the electrode layer (electrode pad) 3 and the organic insulation film 4 on the semiconductor substrate 1.

Next, a photo resist layer 6 is applied on the power supply layer 5 by a spin coating method and exposure, developing and curing processes are performed, so that, as shown in FIG. 1-(c), the opening corresponding to the expected forming position on the electrode layer 3 of the soldering bump 9 is formed in the photo resist layer 6.

Next, an electrolytic plating process is performed, so that, as shown in FIG. 1-(d), a barrier metal layer 7 is formed in the opening in the photo resist layer 6 so that the diffusion of solder in the soldering layer 9 into the electrode layer is prevented.

Next, an electrolytic plating process is made by using the photo resist layer 6 as a mask, so that, as shown in FIG. 1-(e), a tin-silver (Sn—Ag) soldering layer 9 is formed on the barrier metal layer 7. At this time, the soldering layer 9 is formed so as to extend on the photo resist layer 6.

Next, as shown in FIG. 1-(f), the photo resist layer 6 is removed by using release liquid. Furthermore, an unnecessary part of the power supply layer 5 is removed by wet etching wherein the soldering layer 9 is used as an etching mask.

After that, the soldering layer 9 is made molten by reflow heating so that, as shown in FIG. 1-(g), the soldering layer 9 is formed in a substantially spherical shape. In other words, a spherical-shaped soldering bump (soldering ball) 9 is formed on the electrode layer 3 of the semiconductor substrate 1.

In a case where the bump is manufactured by using the printing method, after the barrier metal layer 7 is selectively formed in the opening in the photo resist 6 shown in FIG. 1-(d), as shown in FIG. 2-(a), the photo resist layer 6 is removed by using the release liquid and the wet etching process using the etching liquid is applied to the power supply layer 5.

After that, as shown in FIG. 2-(b), a pattern (not illustrated) for printing is made so that the tin-silver (Sn—Ag) soldering layer 9 is formed on the barrier metal layer 7, and the soldering plating layer 9 is made molten by reflow heating. As a result of this, as shown in FIG. 1-(g), the spherical-shaped soldering bump (soldering ball) 9 is formed on the electrode layer 3 of the semiconductor substrate 1.

An example of a method of mounting the semiconductor element 10 where the bump 9 made of tin-silver (Sn—Ag) soldering is formed on the semiconductor substrate 1, on the printed board 11 is shown in FIG. 3.

As shown in FIG. 3-(a), the semiconductor element 10 where the bump 9 is formed on the semiconductor substrate 1 is mounted on the printed board 11 by a flip chip bonding method. In other words, where the surface of the semiconductor element 10 has the bump 9 formed facing downward, the semiconductor element 10 is mounted on an upper surface, namely a wiring surface of the printed board 11. Here, ball bumps 12 for outside input/output are formed on a lower surface of the printed board 11

Next, as shown in FIG. 3-(b), in order to improve connection reliability, underfill 13 is applied between the semiconductor element 10 and the printed board 11 and cured, so that connection between the semiconductor element 10 and the printed board 11 is reinforced.

Last, as shown in FIG. 3-(c), a passive element 14 such as a condenser or the like is provided in the periphery of the semiconductor element 10 on the printed board 11 and a heat radiation plate 15 for radiating heat generated by the semiconductor element 10 is provided at an upper part of the semiconductor element 10, so that the semiconductor device is formed.

In the meantime, details of forming of the power supply layer 5 on the electrode layer (electrode pad) 3 and the organic insulation film 4 discussed with reference to FIG. 1-(b) and details of the wet etching process for the power supply layer 5 discussed with reference to FIG. 1-(f) and FIG. 2-(a) are discussed with reference to FIG. 4 through FIG. 6.

Here, FIG. 4 is a view for explaining an electrode layer (electrode pad) and a power supply layer on an organic insulating protection film. FIG. 5 is a view for explaining the status of a surface of the organic insulating protection film in processes shown in FIG. 4. FIG. 6 is a view for explaining the status of a surface of the organic insulating protection film in a process for removing the power supply layer by a wet etching process.

In order to form the power supply layer 5 on the electrode layer (electrode pad) 3 and the organic insulation film 4, first, as shown in FIG. 4-(a), a dry etching (RF etching) process is applied to the whole surfaces of the electrode layer (electrode pad) 3 and the organic insulation film 4 by using argon (Ar) gas so that a natural oxide film on the surface of the electrode layer (electrode pad) 3 is removed.

By such a dry etching process, as shown in FIG. 5-(a), a modified layer is generated on a surface layer of the organic insulation film 4. The etching amount of the surface of the organic insulation film 4 at this time is small and the maximum surface roughness of the organic insulation film 4 is approximately 4 nm. Therefore, the surface roughness of the organic insulation film 4 is not dramatically changed by this process.

Next, a metal forming the power supply layer 5 is deposited on the surface of the organic insulation film 4 including the modified layer 20 by sputtering.

More specifically, as shown in FIG. 4-(b), a titanium (Ti) layer 5-1 is formed on a surface of the organic insulation film 4 including the modified layer 20 by sputtering. By such a sputtering, as shown in FIG. 5-(b), titanium is embedded in the surface of the modified layer 20.

Next, as shown in FIG. 4-(c), a copper (Cu) film 5-2 is formed on the surface of the titanium (Ti) film by sputtering. At this time, as shown in FIG. 5-(c), since the copper film 5-2 is deposited on the titanium film 5-1, the copper film 5-2 does not directly come in contact with the organic insulation film 4 and therefore does not influence the surface of the organic insulation film 4.

In the process shown in FIG. 1-(f) in the case of the plating method or in the process shown in FIG. 2-(a) in the case of the printing method, the power supply layer 5 (the titanium film 5-1 and the copper film 5-2) formed on the organic insulation film 4 is removed by the wet etching process.

Next, with reference to FIG. 6, the status of the surface of the organic insulation film 4 in the process whereby the power supply layer 5 is removed by the wet etching process is discussed.

Where the copper film 5-2 is deposited on the titanium film 5-1 as shown in FIG. 6-(a), first, the copper film 5-2 is removed by wet etching as shown in FIG. 6-(b). Since the copper film 5-2 is deposited on the titanium film 5-1, it is possible to easily remove the copper film 5-2.

Next, as shown in FIG. 6-(c), the titanium film 5-1 deposited on the modified layer 20 is removed by wet etching. While the titanium film 5-1 provided on the surface of the modified layer 20 is easily removed, titanium embedded in the surface of the modified layer 20 remains even after the titanium film 5-1 provided on the surface of the modified layer 20 is removed.

FIG. 7 is a view of the soldering bump 9 formed on the semiconductor element 10 of the semiconductor device manufactured by the related art manufacturing method including the above-discussed processes. FIG. 7-(b) is an expanded view of a part surrounded by a broken line in FIG. 7-(a).

Referring to FIG. 7, in the semiconductor element 10 manufactured by the above-discussed processes, the titanium film 5-1, the copper film 5-2 and the barrier metal layer 7 are formed on the organic insulation film 4 in this order. The bump 9 is formed on the barrier metal layer 7.

Titanium 5-1 embedded in the surface of the organic insulation film 4 and remaining as a metal residue is normally not observed by a metal microscope, an electron microscope, or the like. However, approximately 10 atm % of this titanium 5-1, as a maximum, is detected by analysis using X-ray Photoelectron Spectroscopy (XPS). The surface roughness of the organic insulation film 4 is approximately 4 nm as a maximum, which is substantially equal to the surface roughness of the organic insulation film 4 formed on the inorganic insulation film 2 shown in FIG. 1-(a).

Thus, in the semiconductor device manufactured by the related art method, the titanium 5-1 forming the power supply layer 5 remains embedded in the surface of the organic insulation film 4 of the semiconductor element 10 as the metal residue.

However, such a metal residue obstructs adhesion between the organic insulation film 4 and the underfill 13 (See FIG. 3) filling in between the semiconductor element 10 and the printed board 11 for reinforcing the connection between the semiconductor element 10 and the printed board 11. As a result, the reliability of the connection between the semiconductor element 10 and the printed board 11 after the semiconductor element 10 is mounted on the printed board 11 may be degraded.

On the other hand, as discussed above, the surface roughness of the organic insulation film 4 is approximately 4 nm as a maximum, which is substantially equal to the surface roughness of the organic insulation film 4 formed on the inorganic insulation film 2. Therefore, the surface roughness of the organic insulation film 4 is too small to obtain sufficient adhesion with the underfill 13.

Accordingly, the reliability of the connection between the semiconductor element 10 and the printed board 11 after the semiconductor element 10 is mounted on the printed board 11 may be degraded.

Thus, in order to ensure a reliable connection between the semiconductor element 10 and the printed board 11 after the semiconductor element 10 is mounted on the printed board 11, it is necessary to both remove the metal residue remaining embedded in the surface of the organic insulation film 4 and make the surface roughness of the organic insulation film 4 large so that sufficient adhesion with the underfill 13 can be obtained.

If the organic insulation film 4 in the vicinity of the bump 9 is removed for the above-mentioned purpose, when the semiconductor element 10 is mounted on the printed board 11, stress is concentrated on the organic insulation film 4 in the vicinity of the bump 9. As a result, cracks may be generated in this part, and therefore the reliability of the connection between the semiconductor element 10 and the printed board 11 after the semiconductor element 10 is mounted on the printed board 11 may be degraded.

SUMMARY OF THE INVENTION

Accordingly, the present invention may provide a novel and useful semiconductor device and manufacturing method of the same solving one or more of the problems discussed above.

Another and more specific object of the present invention may be to provide a semiconductor device whereby sufficient adhesion between an organic insulation film of a semiconductor element and an underfill can be obtained and concentration of a stress in the organic insulation film in the vicinity of a bump can be avoided so that reliability of connection between the semiconductor element and a printed circuit board where the semiconductor element is mounted can be improved, and a manufacturing method of said semiconductor device.

The above object of the present invention is achieved by a semiconductor device, including:

a plurality of electrode layers provided at designated positions of a semiconductor substrate;

an organic insulation film formed on the semiconductor substrate by selectively exposing designated areas of the electrode layers; and projection electrodes for outside connection, the projection electrodes being formed on the designated areas of the electrode layers;

wherein thickness of the organic insulation film situated in the vicinity of the periphery of the projection electrodes is greater than thickness of the organic insulation film situated between the projection electrodes.

The above object of the present invention is also achieved by a manufacturing method of a semiconductor device, the semiconductor device including electrode layers provided at designated positions of a semiconductor substrate;

an organic insulation protection film continuously covering a gap between the neighboring electrode layers so that substantially centers of the electrode layers are exposed; and projection electrodes for outside connection, the projection electrodes being connected to the electrode layers;

the manufacturing method including the step of:

etching a surface of the organic insulation protection film by a dry etching process after the projection electrode is formed on the electrode layer.

According to an embodiment of the present invention, it is possible to provide the semiconductor device whereby sufficient adhesion between the organic insulation film of the semiconductor element and the underfill can be obtained and concentration of the stress in the organic insulation film in the vicinity of the bump can be avoided so that reliability of connection between the semiconductor element and the printed circuit board where the semiconductor element is mounted can be improved, and the manufacturing method of said semiconductor device.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 8 through FIG. 15 of embodiments of the present invention.
[First Embodiment]

A forming process of a soldering bump by using a plating method of a manufacturing method of a semiconductor device of a first embodiment of the present invention, is discussed with reference to FIG. 8 and FIG. 9.

Figure 8:
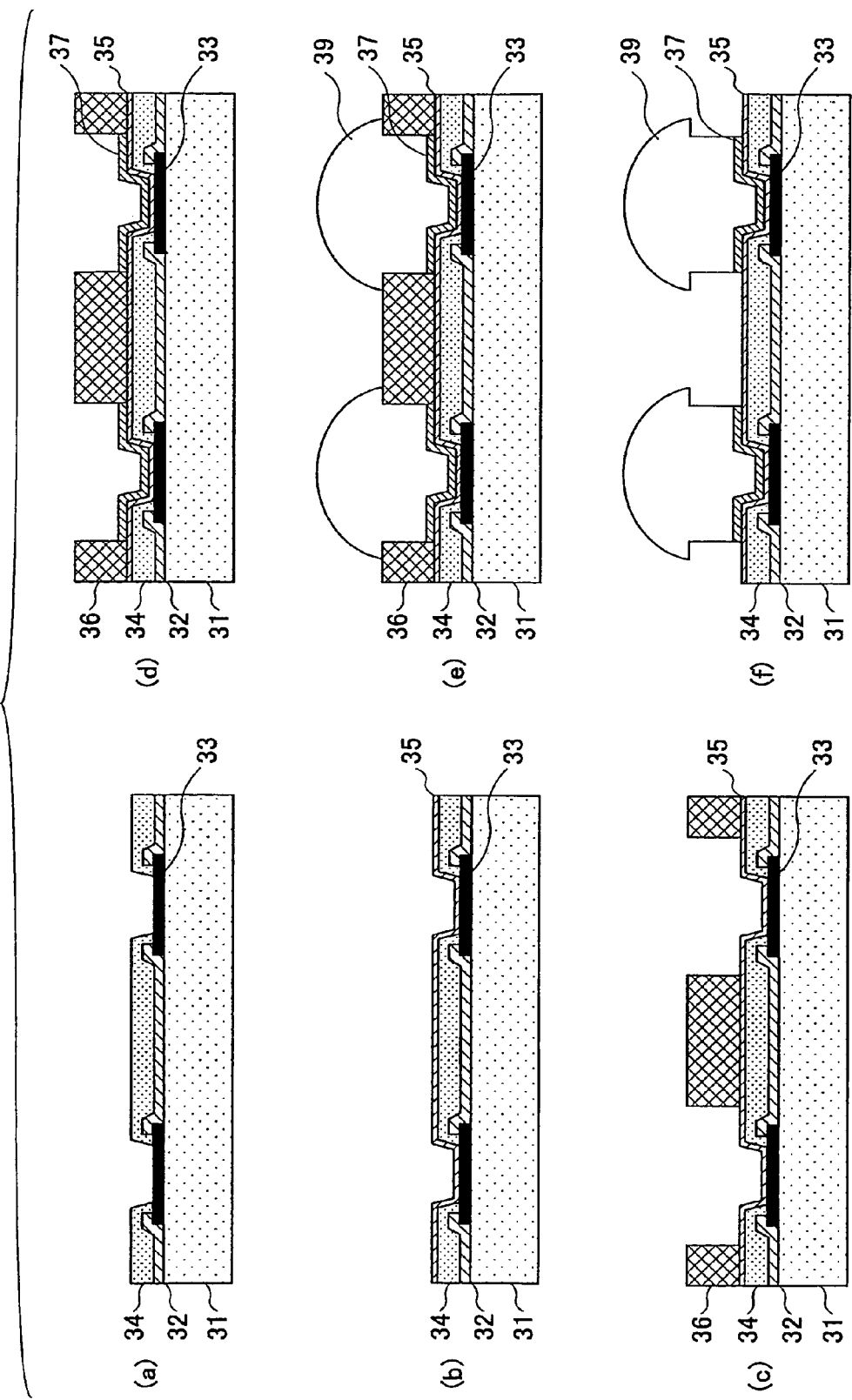
FIG. 8 is a view (part 1) showing a forming process of the solder bump by a plating method in a manufacturing method of a semiconductor device of a first embodiment of the present invention.

Here, FIG. 8 is a view (part 1) showing a forming process of the solder bump by a plating method in a manufacturing method of a semiconductor device of a first embodiment of the present invention. FIG. 9 is a view (part 2) showing the forming process of the solder bump by the plating method in the manufacturing method of the semiconductor device of the first embodiment of the present invention.

In the forming process of the soldering bump by using the plating method of the manufacturing method of a semiconductor device of a first embodiment of the present invention, as shown in FIG. 8-(a), an electrode layer (electrode pad) 33 made of aluminum (Al) or the like is provided on an upper surface of a semiconductor substrate 31 made of silicon (Si). In addition, an inorganic insulation film (passivation film) 32 made of silicon nitride (SiN) or the like is formed in the periphery of the electrode layer 33.

Figure 1:
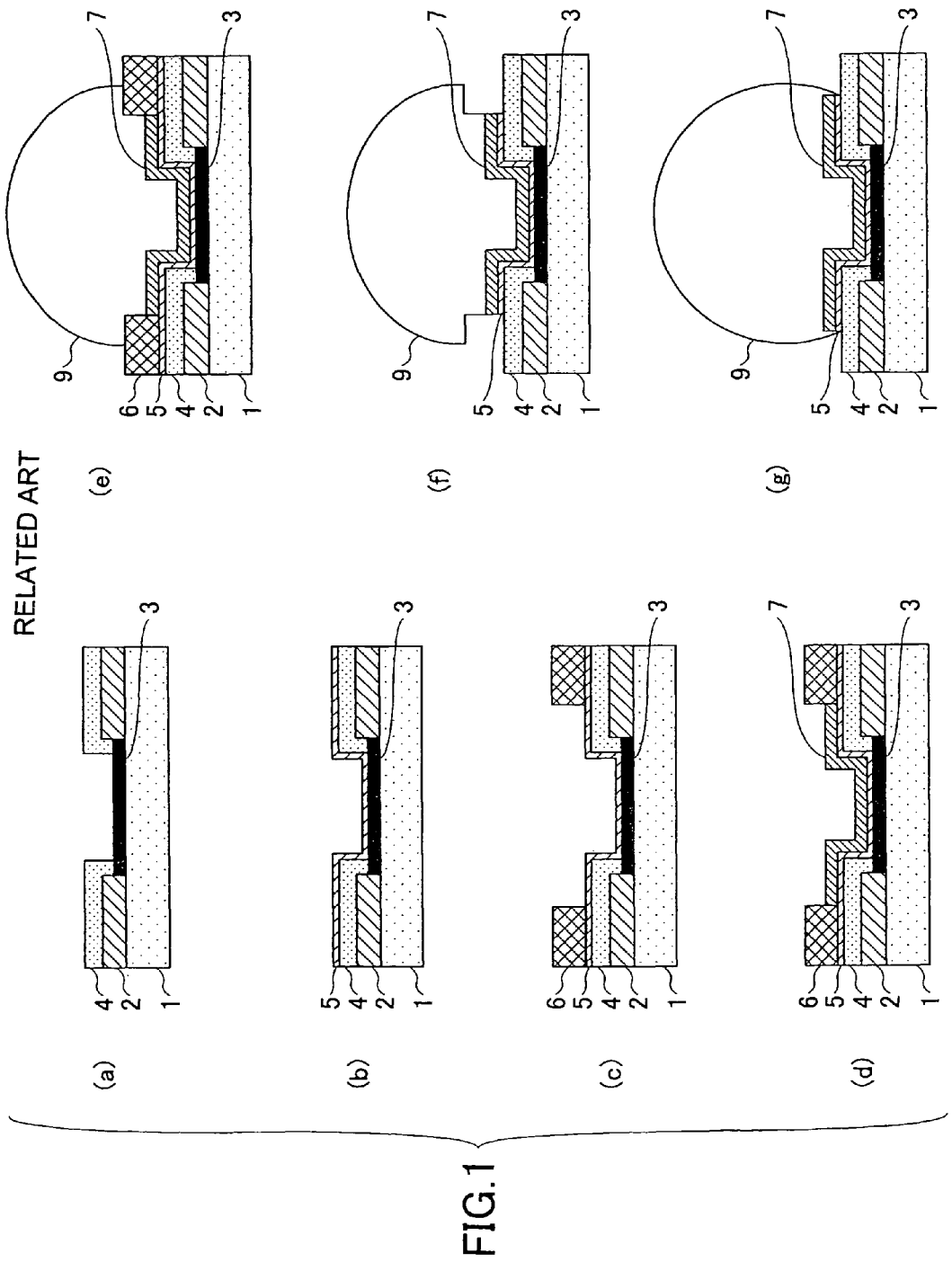
FIG. 1 is a view for explaining a plating bump process by using a related art manufacturing method of a semiconductor device.
Figure 2:
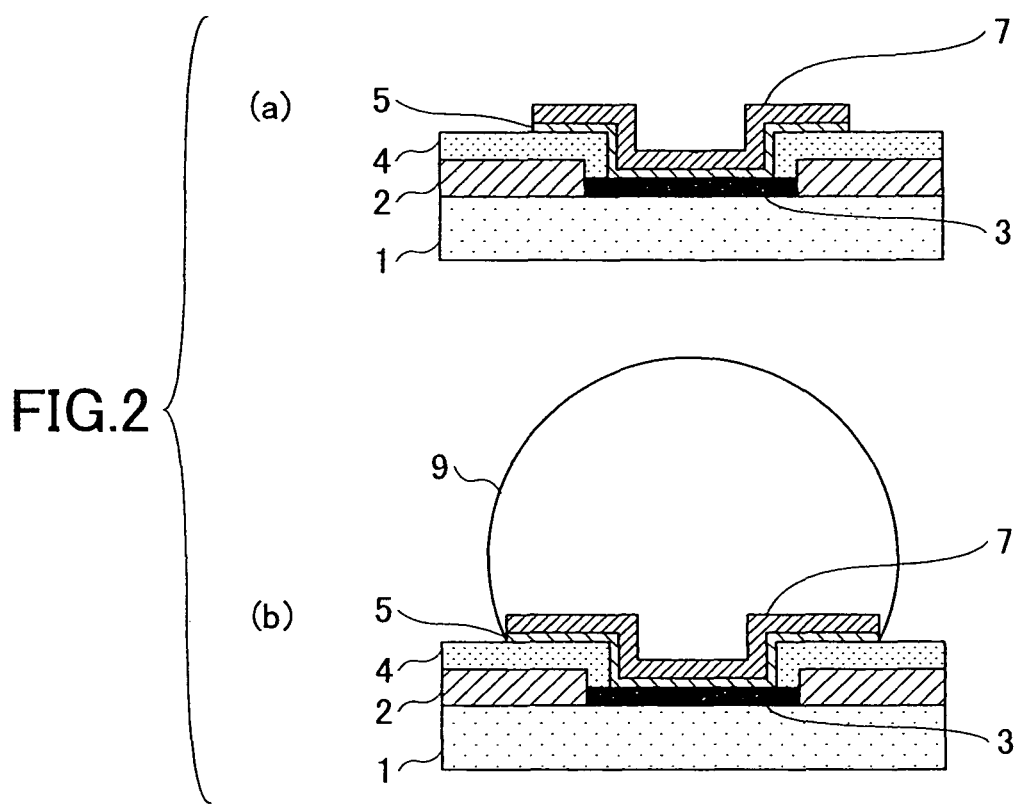
FIG. 2 is a view for explaining a forming process of the bump by using a printing method in the related art manufacturing method of the semiconductor device.
Figure 3:
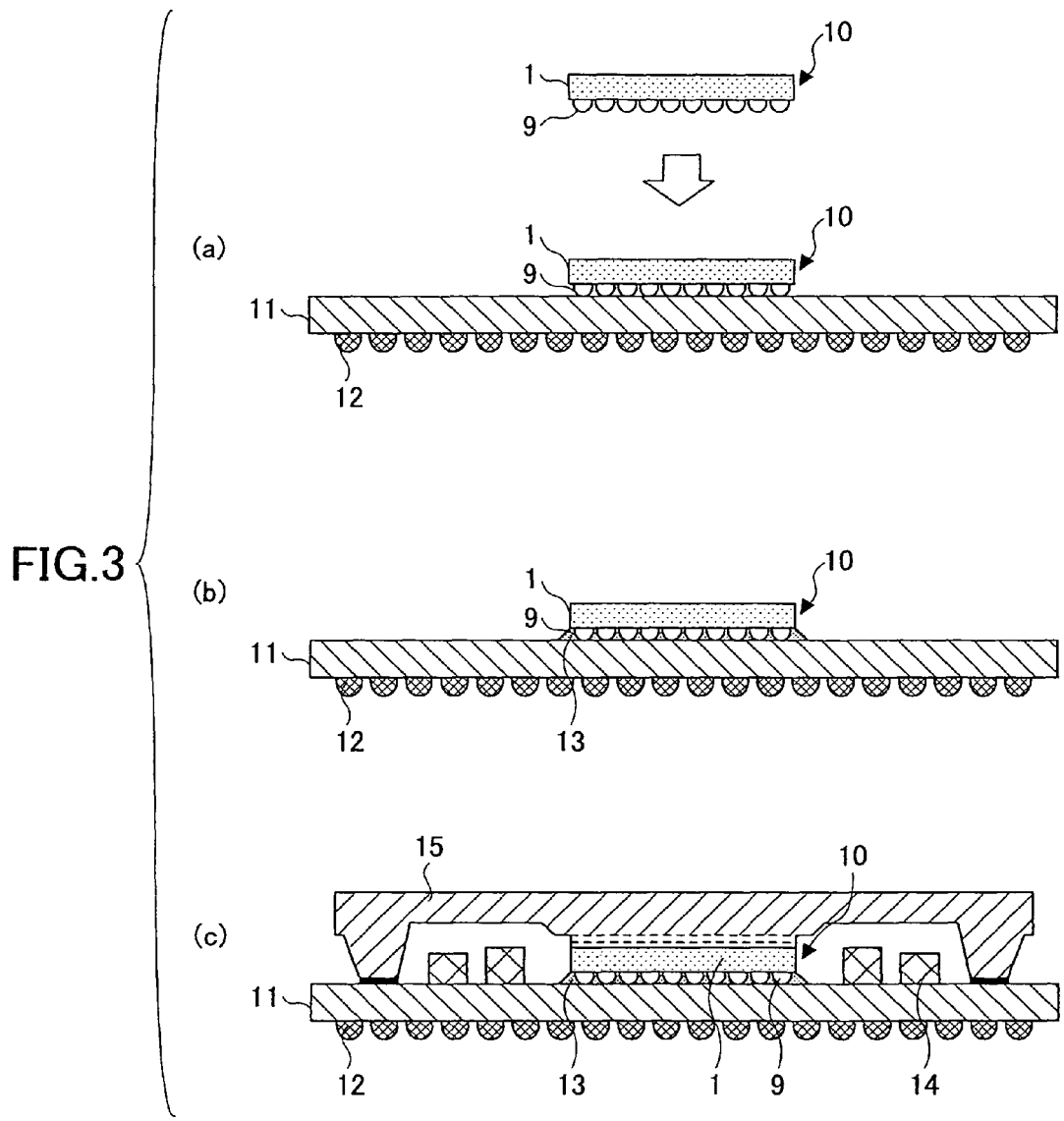
FIG. 3 is a view showing an example of a method for mounting the semiconductor element having the bump on the printed circuit board.
Figure 4:
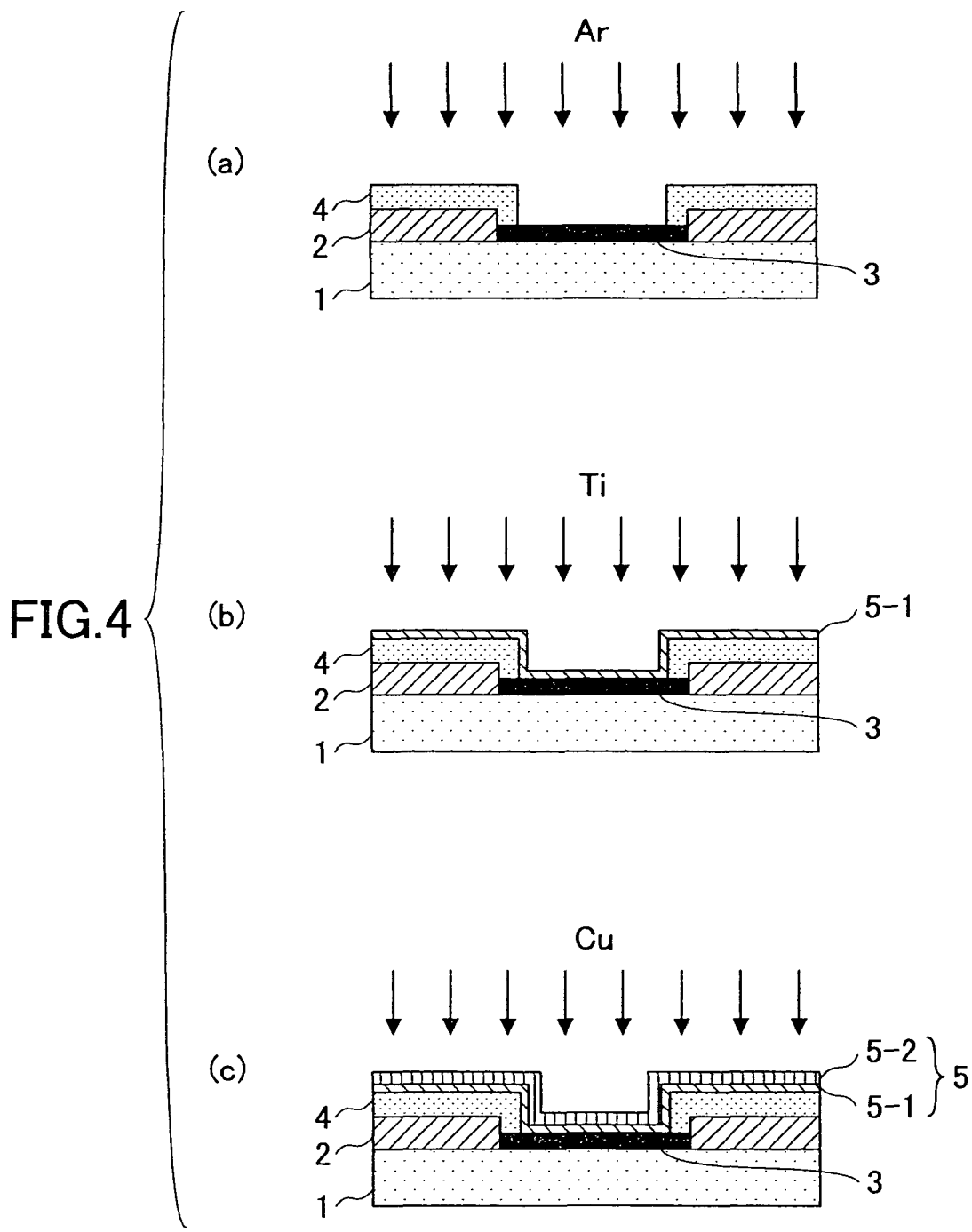
FIG. 4 is a view for explaining an electrode layer (electrode pad) and a power supply layer on an organic insulating protection film.
Figure 5:
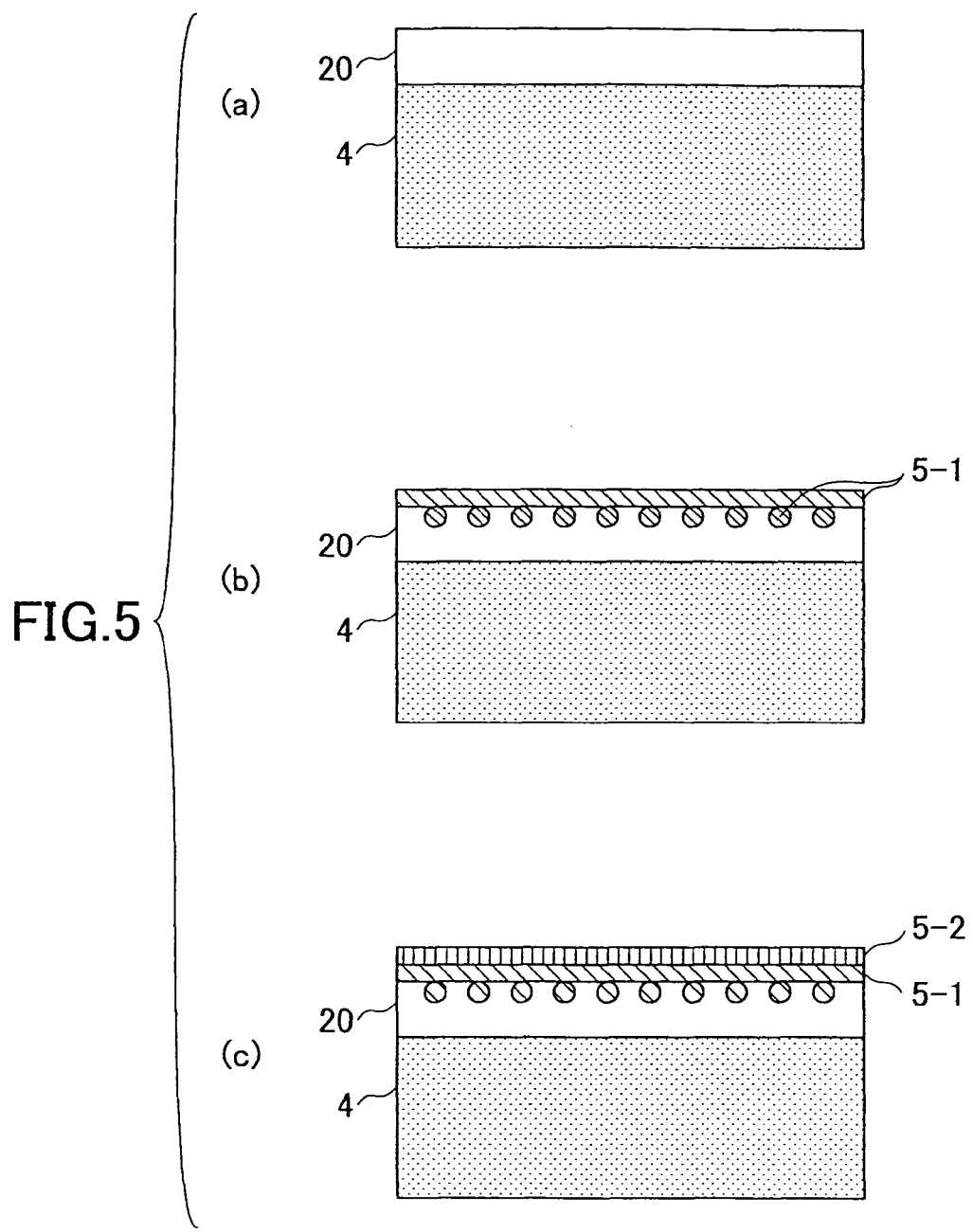
FIG. 5 is a view for explaining the status of a surface of the organic insulating protection film in processes shown in FIG. 4.
Figure 6:
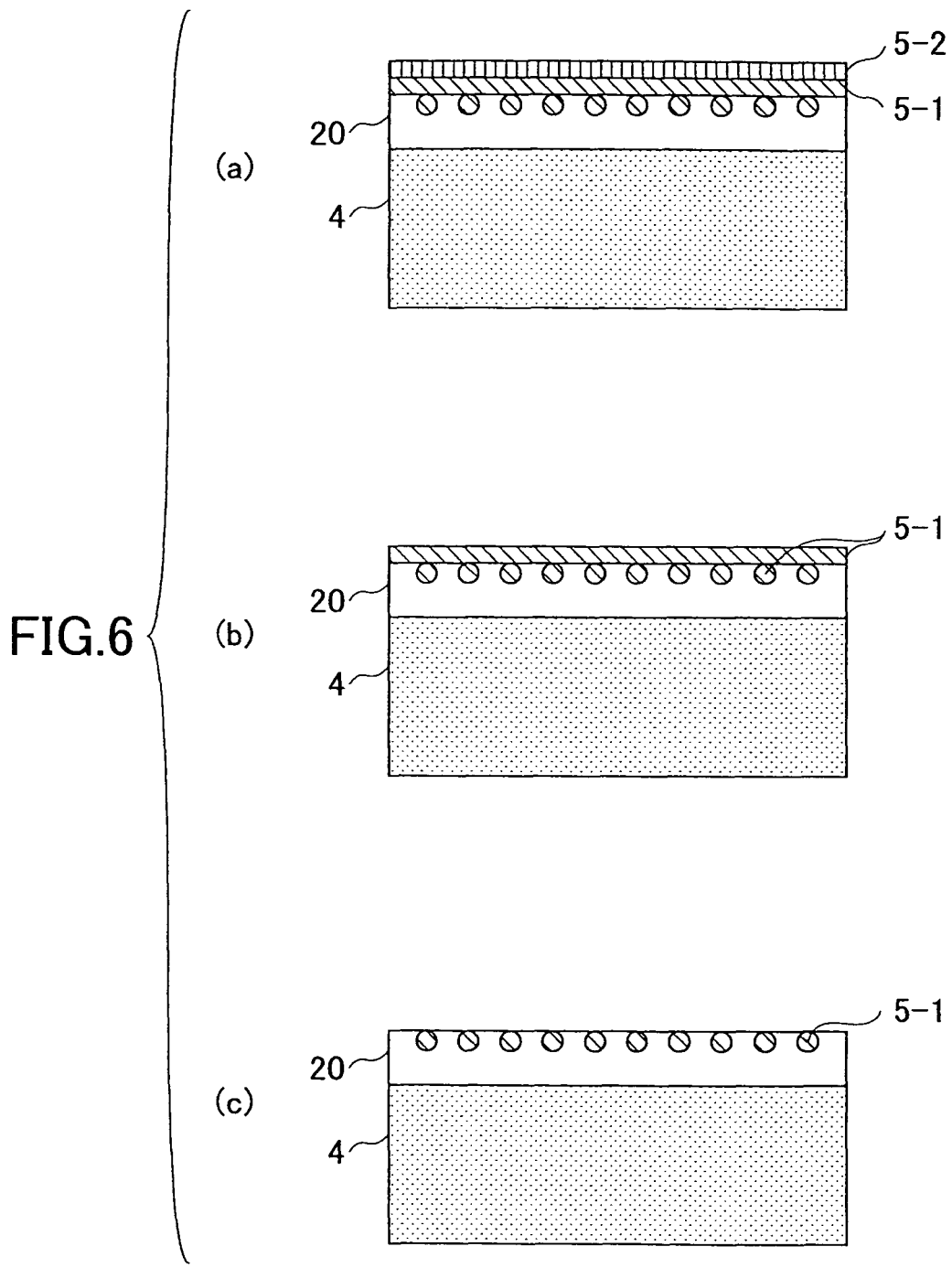
FIG. 6 is a view for explaining the status of a surface of the organic insulating protection film in a process for removing the power supply layer by a wet etching process.

In addition, an organic insulation film 34 such as a polyimide resin layer or the like is provided on the inorganic insulation film 32. The organic insulation film 34 is formed for surface protection of the semiconductor element and for easing stress concentrated on a base of the bump 39 when the semiconductor element is mounted on a wiring board 11 (See FIG. 3).

An opening is formed in the inorganic insulation film 32 and the organic insulation film 34 as corresponding to an expected forming position on the electrode layer 33 of the soldering bump 39 so that a pad is exposed.

Figure 9:
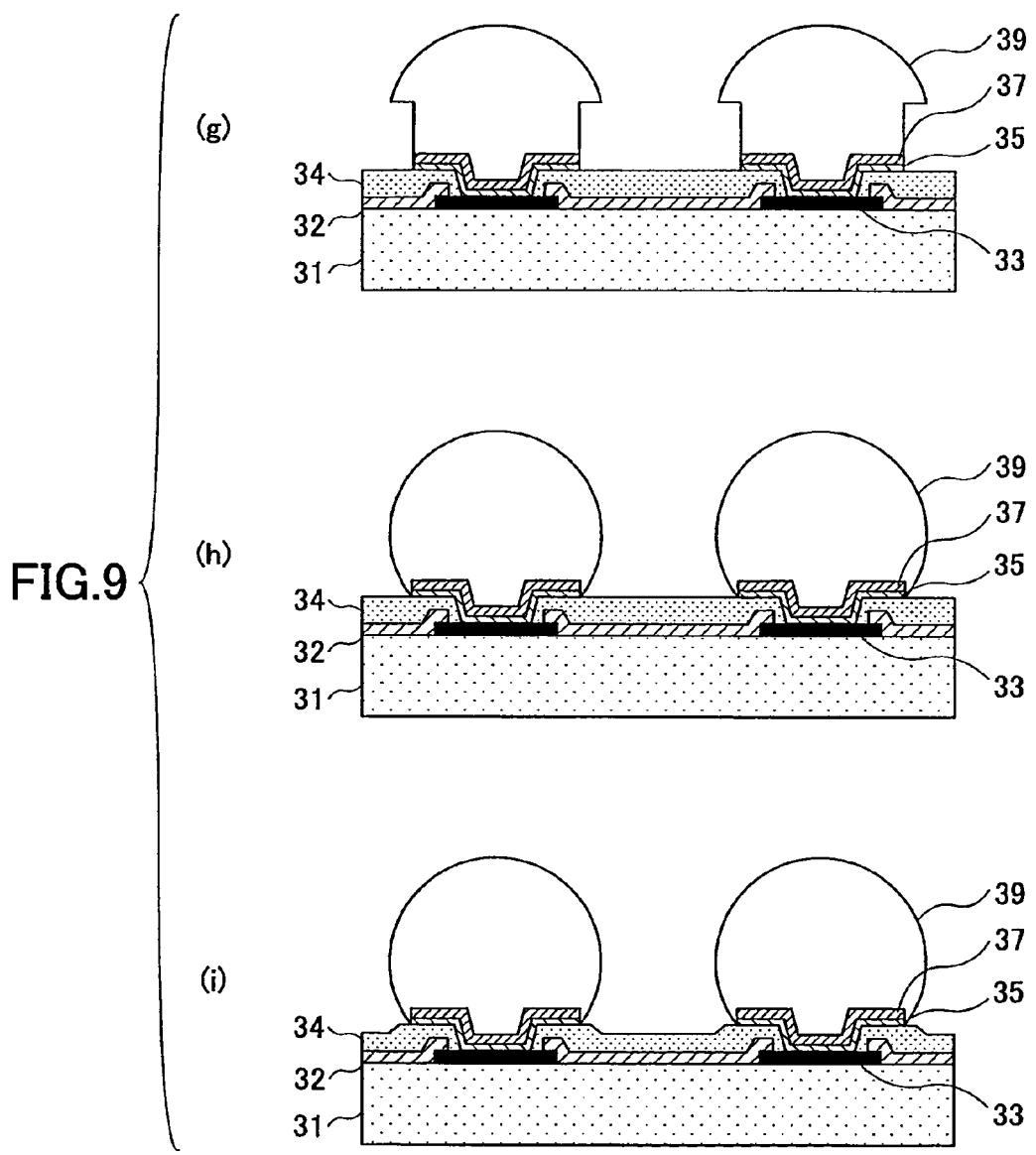
FIG. 9 is a view (part 2) showing the forming process of the solder bump by the plating method in the manufacturing method of the semiconductor device of the first embodiment of the present invention.

Illustration of an active element such as a transistor, and a passive element such as resistor element or capacity element formed on the semiconductor substrate 31, an isolation area for insulation-isolating between these elements, an interlayer insulation layer, an inter-element mutual wiring layer, or the like is omitted in FIG. 8 and FIG. 9.

Next, as shown in FIG. 8-(b), a power supply layer 35 as a plating electrode is formed on whole surfaces of the electrode layer (electrode pad) 33 and the organic insulation film 34 provided on the semiconductor substrate 31.

In order to form the power supply layer 35 on the electrode layer (electrode pad) 33 and the organic insulation film 34, a dry etching (RF etching) process using argon (Ar) gas is applied so that a natural oxide film on the surface of the electrode layer (electrode pad) 33 is removed.

As discussed above, by such a dry etching process, a modified layer (not shown) is generated on a surface of the organic insulation film 34.

After that, a titanium (Ti) layer 35-1 (See FIG. 10) is formed on the surface of the organic insulation film 34 by sputtering. By such a sputtering, titanium is embedded in the surface of the modified layer on the surface of the organic insulation film 34.

Next, a copper (Cu) film 35-2 is formed on the surface of the titanium (Ti) film 35-1 by sputtering. At this time, since the copper film 35-2 is deposited on the titanium film 35-1, the copper film 35-2 does not directly come in contact with the organic insulation film 34 and therefore does not influence the surface of the organic insulation film 34.

Next, photo resist is applied on the power supply layer 35 by a spin coating method and exposure, developing and curing processes are performed, so that, as shown in FIG. 8-(c), the photo resist layer 36 having the opening pattern corresponding to the expected forming position on the electrode layer 33 of the soldering bump 39 is formed.

Next, an electrolytic plating process is performed, so that, as shown in FIG. 8-(d), a barrier metal layer 37 is formed in the opening in the photo resist layer 36 so that the diffusion of solder in the soldering layer is prevented.

Next, an electrolytic plating process is performed by using the photo resist layer 36 as a mask, so that, as shown in FIG. 8-(e), a tin-silver (Sn—Ag) soldering layer 39 is formed on the barrier metal layer 37. At this time, the soldering layer 39 is formed so as to extend on the photo resist layer 36.

Next, as shown in FIG. 8-(f), the photo resist layer 36 is removed by using release liquid. Furthermore, as shown in FIG. 9-(g), an unnecessary part of the power supply layer 35 is removed by wet etching wherein the soldering layer 39 is used as an etching mask.

After that, the soldering layer 39 is made molten by reflow heating so that, as shown in FIG. 9-(h), the soldering layer 39 is shaped in a substantially spherical shape. In other words, a spherical-shaped soldering bump (soldering ball) 39 as a projection electrode for outside connection is formed on the electrode layer 33 of the semiconductor substrate 31.

In this embodiment, after the soldering bump (soldering ball) 39 is completely formed, as shown in FIG. 9-(i), the surface of the organic insulation film 34 is etched by a dry etching process. In addition, in this embodiment, the surface of the organic insulation film 34 is etched by a dry etching process using radio frequency (RF) plasma etching or the like.

In a process using a down flow type apparatus generally used for etching the surface of an organic insulation film, it is difficult to etch the surface of the organic insulation film where the soldering bump is formed. Mixed gas of oxygen ($O_2$) and carbon tetrafluoride ($CF_4$) may be used for such a dry etching process. In this case, for example, the dry etching process may be performed for approximately 45 seconds under a radio frequency plasma atmosphere of approximately 150 W under the conditions that the flow amount of oxygen ($O_2$) is approximately 400 sccm and the flow amount of carbon tetrafluoride ($CF_4$) is approximately 100 sccm.

However, the flow amounts of the mixed gas are not limited to the above-mentioned example. For example, the mixture ratio of the two gases may be the same while the flow amounts of both gases are changed. In addition, the material for the gas is not limited to the above-mentioned example. For example, trifluoromethane ($CHF_3$) gas may be used.

Figure 10:
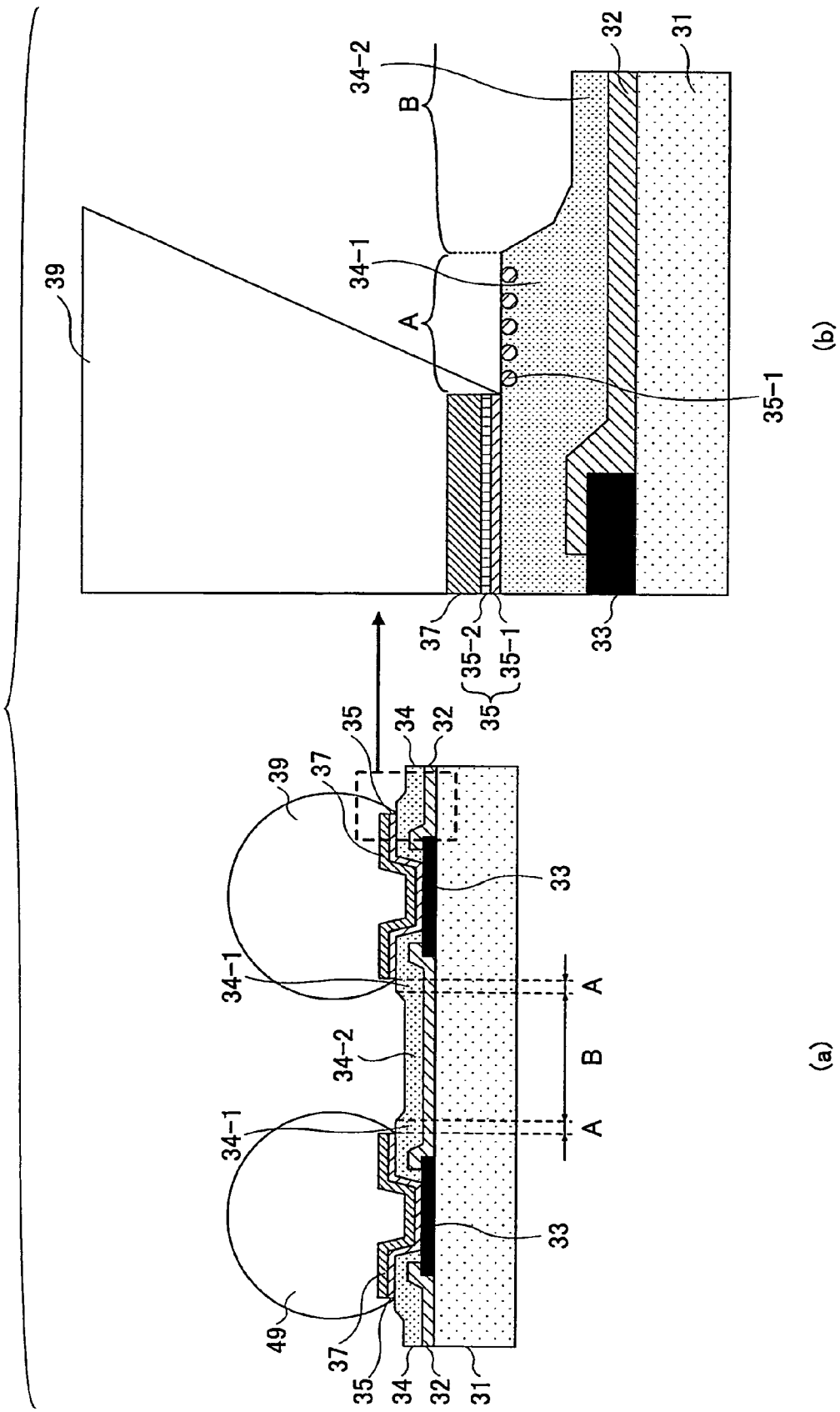
FIG. 10 is a view of the bump formed on the semiconductor element of the semiconductor device manufactured by the manufacturing method of the first embodiment of the present invention.

FIG. 10 is a view of the bump formed by the above-discussed processes. FIG. 10-(b) is an expanded view of a part surrounded by a broken line in FIG. 10-(a).

Referring to FIG. 10, the titanium film 35-1, the copper film 35-2 and the barrier metal layer 37 are formed on from the aluminum electrode layer (electrode pad) 33 and the organic insulation film 34 in this order. The bump 39 as the projection electrode for outside connection is formed on the barrier metal layer 37. The organic insulation film 34 continuously covers the surface of the semiconductor element existing between the neighboring electrode layers 33.

Here, an organic insulation film on which the power supply layer 35 is not provided and in an area "A" inside of a point of the external periphery of the bump 39 and in a direction parallel to the main surface of the semiconductor substrate 31, that is, an organic insulation film in the vicinity of the bump 39, is called a bump-vicinity organic insulation film 34-1. An organic insulation film in an area "B", namely an area other than area A, is called an etched organic insulation film 34-2.

The thickness of the bump-vicinity organic insulation film 34-1, that is, the distance between the upper surface of the bump-vicinity organic insulation film 34-1 and a surface of the inorganic insulation film 32 coming in contact with the bump-vicinity organic insulation film 34-1, is substantially equal to the distance between the upper surface of the organic insulation film 34 when covering the inorganic insulation film 32 as shown in FIG. 8-(a) and the surface of the inorganic insulation film 32 coming in contact with the bump-vicinity organic insulation film 34-1.

On the other hand, substantially 50 through 400 nm of the etched organic insulation film 34-2 is dry etched by the etching process discussed with reference to FIG. 9-(i) so that the etched organic insulation film 34-2 is thinner than the bump-vicinity organic insulation film 34-1.

Thus, while the etched organic insulation film 34-2 being thinner than the bump-vicinity organic insulation film 34-1 is formed by the dry etching process shown in FIG. 9-(i), the bump-vicinity organic insulation film 34-1 being thicker than the etched organic insulation film 34-2 is provided in the periphery of the bump 39. Therefore, even if the stress is concentrated on the bump-vicinity organic insulation film 34-1 when the semiconductor element is mounted on a wiring board 11 (See FIG. 3), it is possible to prevent the generation of cracks at this part.

In addition, the surface roughness of the bump-vicinity organic insulation film 34-1 is approximately 4 nm as a maximum, which is substantially equal to the surface roughness of the organic insulation film 34 when the organic insulation film 34 is formed on the inorganic insulation film 32 as shown in FIG. 8-(a).

On the other hand, the surface roughness of the etched organic insulation film 34-2 is equal to or greater than 5 times the surface roughness of the bump-vicinity organic insulation film 34-1, namely equal to or greater than approximately 20 nm, by the process shown in FIG. 9-(g).

Therefore, it is possible to obtain sufficient adhesion between the underfill 13 (See FIG. 3) and the organic insulation film 34 so that the reliability of the connection between the semiconductor element 10 and the printed board 11 after the semiconductor element 10 is mounted on the printed board 11 can be secured.

In addition, in the process shown in FIG. 8-(b), when the titanium (Ti) film 35 is formed on the organic insulation film 34 by sputtering after the etching process using argon (Ar), titanium (Ti) is embedded in the modified layer situated on the surface of the organic insulation film 34 and remains as the metal residue.

According to the analysis using the X-ray Photoelectron Spectroscopy (XPS), 10 atm %, as a maximum, of the metal residue remains in the bump-vicinity organic insulation film 34-1 and only approximately 0.1 atm % or less of the metal residue remains in the etched organic insulation film 34-2 because the metal residue is removed together with the organic insulation film 34 by the process shown in FIG. 9-(g).

Thus, since almost all of the metal residue is removed from the etched organic insulation film 34-2, it is possible to obtain sufficient adhesion between the underfill 13 and the organic insulation film 34 so that the reliability of the connection between the semiconductor element 10 and the printed board 11 after the semiconductor element 10 is mounted on the printed board 11 can be secured.

According to the first embodiment of the present invention, the etched organic insulation film 34-2 whose surface roughness is greater than the surface roughness of the bump-vicinity organic insulation film 34-1 is formed by the dry etching process shown in FIG. 9-(i), and the metal residue embedded in the surface of the organic insulation film 34-2 is removed by the process shown in FIG. 9-(i).

On the other hand, the thickness of the bump-vicinity organic insulation film 34-1 is not changed from the thickness of the organic insulation film 34 when the organic insulation film 34 is formed on the inorganic insulation film 32 as shown in FIG. 8-(a). Therefore, the strength in the vicinity of the bump 39 is not reduced.

Thus, according to the first embodiment of the present invention, it is possible to obtain sufficient adhesion between the underfill 13 and the organic insulation film 34 and avoid concentration of stress on the bump-vicinity organic insulation film 34-1 in the vicinity of the burn 39, so that the reliability of the connection between the semiconductor element 10 and the printed board 11 after the semiconductor element 10 is mounted on the printed board 11 can be secured.

In the first embodiment of the present invention, a case where the bump is formed by the plating method is discussed. However, the present invention is not limited to this. For example, the bump shown in FIG. 10 can be formed by dry etching the surface of the organic insulation film 37 as shown in FIG. 9-(i) in a case where the bump is formed by using a transferring bump method, paste bump method, or screen printing method.

In addition, tin-silver (Sn—Ag) is used as an example of bump material in the first embodiment of the present invention. However, the bump material is not limited to this. For example, tin-silver-copper (Sn—Ag—Cu), tin-bismuth (Sn—Bi), tin-lead (Sn—Pb), or the like may be used as the bump material.

[Second Embodiment]

A forming process of a soldering bump by using a plating method of a manufacturing method of a semiconductor device of a second embodiment of the present invention, is discussed with reference to FIG. 11 through FIG. 13.

Figure 11:
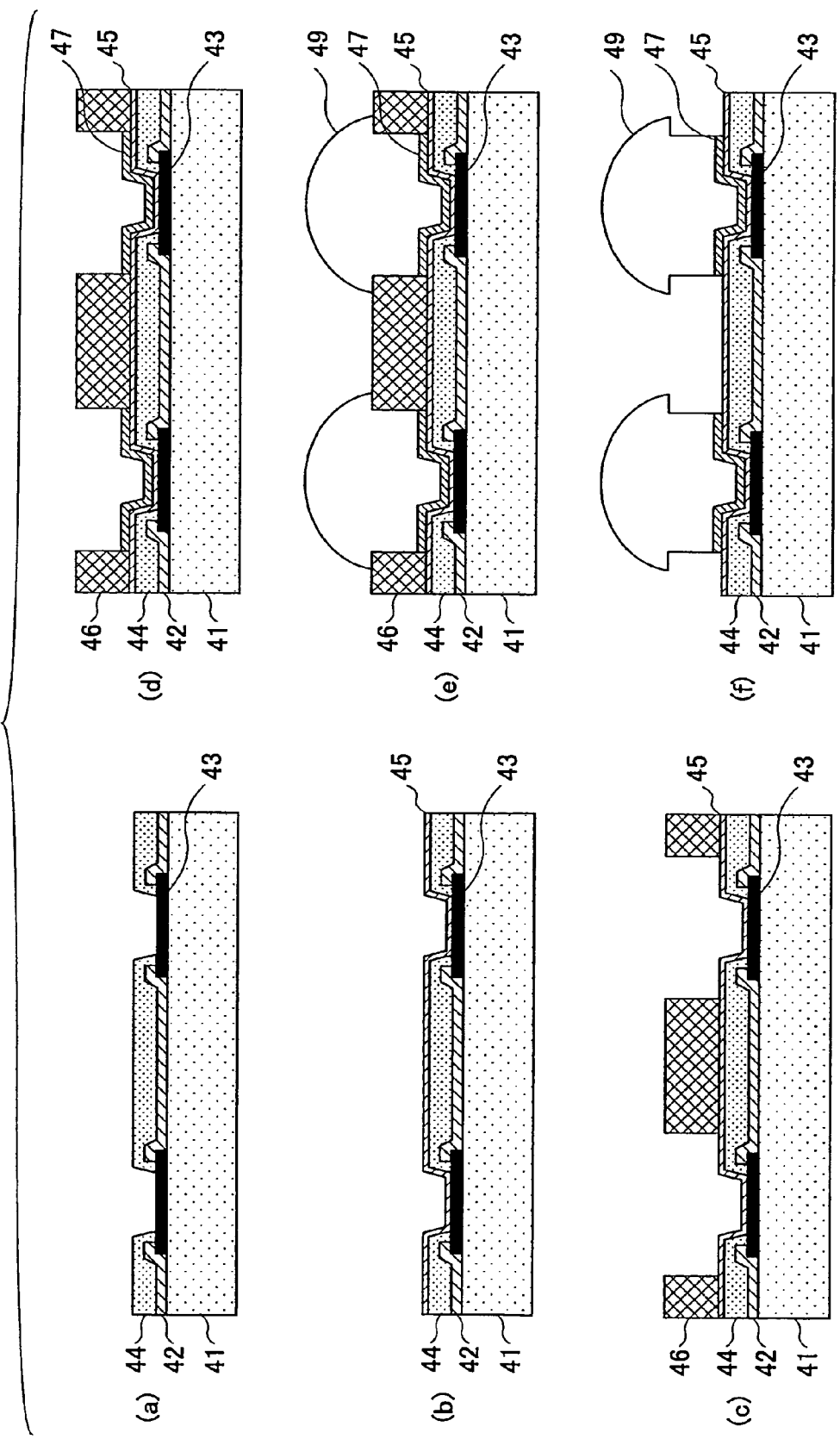
FIG. 11 is a view (part 1) showing a forming process of the solder bump by a plating method in a manufacturing method of a semiconductor device of a second embodiment of the present invention.

Here, FIG. 11 is a view (part 1) showing a forming process of the solder bump by a plating method in a manufacturing method of a semiconductor device of a second embodiment of the present invention. FIG. 12 is a view (part 2) showing the forming process of the solder bump by the plating method in the manufacturing method of the semiconductor device of the second embodiment of the present invention. FIG. 13 is an expanded view of a part surrounded by a broken line in FIG. 12.

In the forming process of the soldering bump by using the plating method of the manufacturing method of a semiconductor device of a first embodiment of the present invention, as shown in FIG. 11-(a), an electrode layer (electrode pad) 43 made of aluminum (Al) or the like is provided on an upper surface of a semiconductor substrate 41 made of silicon (Si). In addition, an inorganic insulation film (passivation film) 42 made of silicon nitride (SiN) or the like is formed in the periphery of the electrode layer 43.

In addition, an organic insulation film 44 such as a polyimide resin layer or the like is provided on the inorganic insulation film 42. The organic insulation film 44 is formed for surface protection of the semiconductor element and for easing stress concentrated on a base of the bump 49 when the semiconductor element is mounted on a wiring board 41 (See FIG. 3).

An opening is formed in the inorganic insulation film 42 and the organic insulation film 44 as corresponding to an expected forming position on the electrode layer 43 of the soldering bump 49 so that a pad is exposed.

Figure 12:
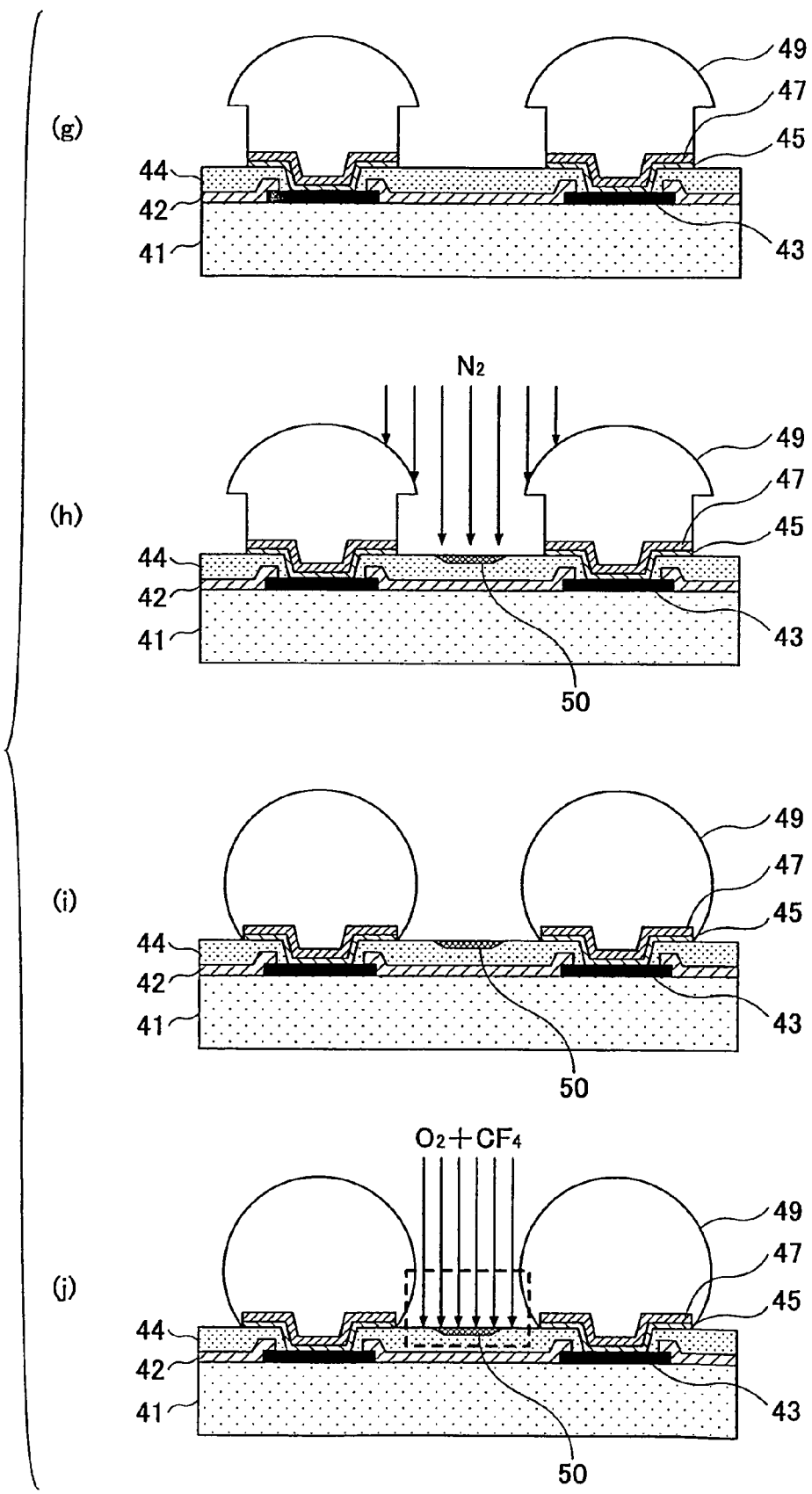
FIG. 12 is a view (part 2) showing the forming process of the solder bump by the plating method in the manufacturing method of the semiconductor device of the second embodiment of the present invention.
Figure 13:
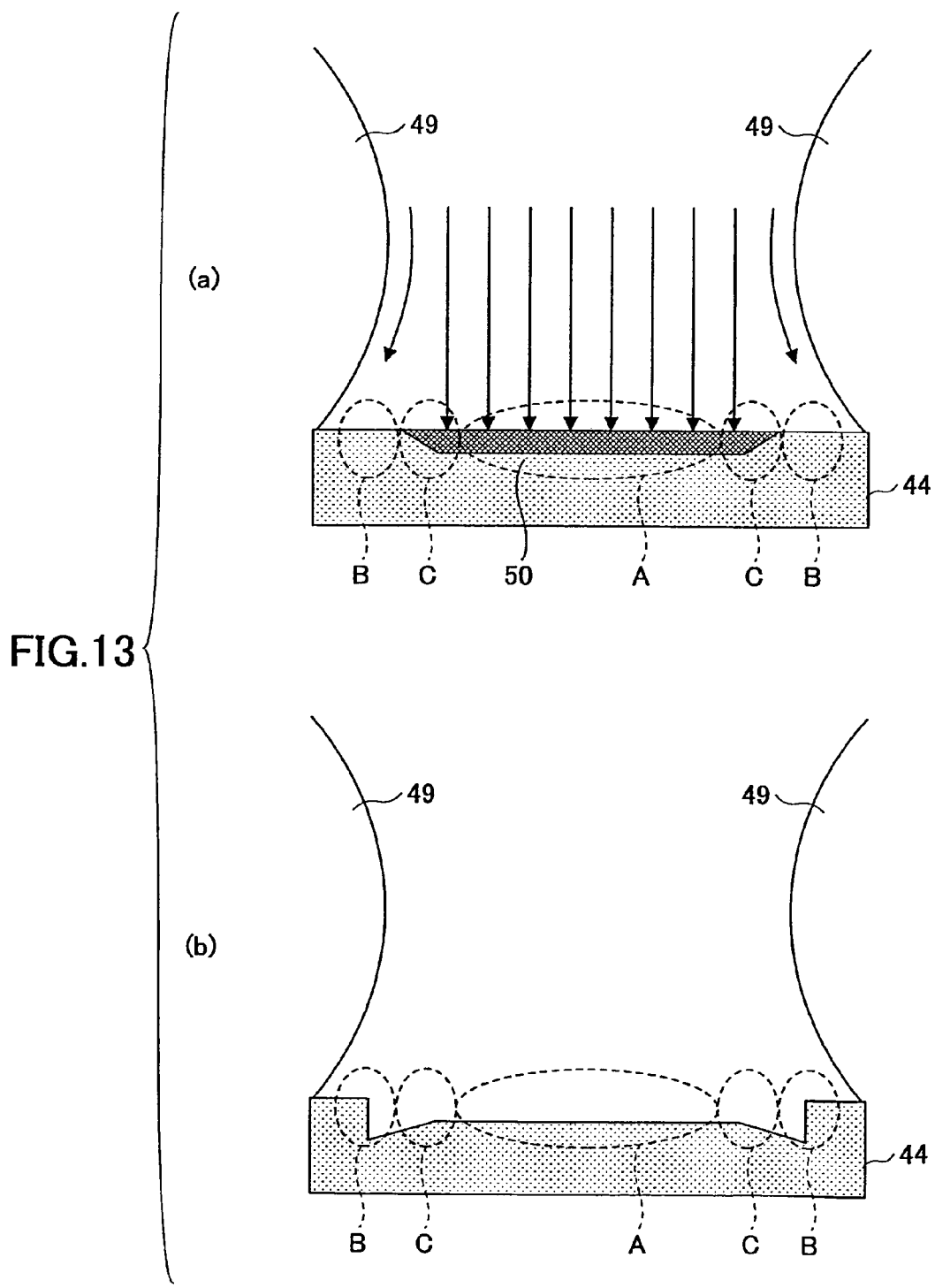
FIG. 13 is an expanded view of a part surrounded by a broken line in FIG. 12.

Illustration of an active element such as a transistor, and a passive element such as resistor element or capacity element formed on the semiconductor substrate 41, an isolation area for insulation-isolating between these elements, an interlayer insulation layer, an inter-element mutual wiring layer, or the like is omitted in FIG. 11 through FIG. 13.

Next, as shown in FIG. 11-(b), a power supply layer 45 as a plating electrode is formed on whole surfaces of the electrode layer (electrode pad) 43 and the organic insulation film 44 provided on the semiconductor substrate 41.

In order to form the power supply layer 45 on the electrode layer (electrode pad) 43 and the organic insulation film 44, a dry etching (RF etching) process using argon (Ar) gas is applied so that a natural oxide film on the surface of the electrode layer (electrode pad) 43 is removed.

As discussed above, by such a dry etching process, a modified layer (not shown) is generated on the surface of the organic insulation film 44.

After that, a titanium (Ti) layer 45-1 (See FIG. 14) is formed on the surface of the organic insulation film 44 by sputtering. By such a sputtering, titanium is embedded in the surface of the modified layer on the surface of the organic insulation film 44.

Next, a copper (Cu) film 45-2 (See FIG. 14) is formed on the surface of the titanium (Ti) film 45-1 by sputtering. At this time, since the copper film 45-2 is deposited on the titanium film 45-1, the copper film 45-2 does not directly come in contact with the organic insulation film 44 and therefore does not influence the surface of the organic insulation film 44.

Next, photo resist is applied on the power supply layer 45 by a spin coating method and exposure, developing and curing processes are performed, so that, as shown in FIG. 11-(c), the photo resist layer 46 having the opening pattern corresponding to the expected forming position on the electrode layer 43 of the soldering bump 49 is formed.

Next, an electrolytic plating process is performed, so that, as shown in FIG. 11-(d), a barrier metal layer 47 is formed in the opening in the photo resist layer 36 so that the diffusion of solder in the soldering layer is prevented.

Next, an electrolytic plating process is performed by using the photo resist layer 46 as a mask, so that, as shown in FIG. 11-(e), a tin-silver (Sn—Ag) soldering layer 49 is formed on the barrier metal layer 47. At this time, the soldering layer 49 is formed so as to extend on the photo resist layer 46.

Next, as shown in FIG. 11-(f), the photo resist layer 46 is removed by using release liquid.

Furthermore, as shown in FIG. 12-(g), an unnecessary part of the power supply layer 45 is removed by a wet etching wherein the soldering layer 49 is used as an etching mask.

In this embodiment, after the power supply layer 45 is removed by the wet etching process, as shown in FIG. 12-(h), the dry etching process is applied so that the surface of the organic insulation layer 44 is modified.

More specifically, the surface of the organic insulation film 44 is dry etched by radio frequency (RF) plasma using nitrogen ($N_2$) as gas. As a process condition, for example, the flow amount of the nitrogen gas is approximately 500 sccm and the power of the radio frequency (RF) plasma is approximately 400 W.

Gas used in this process is not limited to nitrogen ($N_2$) gas. For example, argon (Ar) gas may be used.

By such a plasma process, surface bonding in an area not covered with the soldering layer 49 in a surface of the organic insulation film 44 becomes strong (tight). As a result of this, the surface is modified so that it may be difficult to apply the dry etching process using mixed gas of oxygen ($O_2$) and carbon tetrafluoride ($CF_4$). Such a modified part is indicated by numerical reference "50" in FIG. 12-(h).

On the other hand, no influence of the dry etching process is given to a part not contacting the plasma and shaded by the soldering layer 49 on the surface of the organic insulation film 44 so that this part is not modified.

In the plasma process shown in FIG. 12-(h), the surface of the organic insulation film 44 is mostly not etched. Even if the surface of the organic insulation film 44 is etched, the etched amount is equal to or less than several nm. In addition, the surface roughness of the organic insulation film 44 is mostly not changed. The surface roughness of the organic insulation film 44 is approximately 4 nm as a maximum, which is substantially equal to the surface roughness of the organic insulation film 44 in a state where the organic insulation film 44 is formed on the inorganic insulation film 42 shown in FIG. 11-(a).

Influence of the nitrogen gas is given to the vicinity of a border of an exposed area not shaded by the soldering layer 49 and the area shade by the soldering layer 49 on the surface of the organic insulation film 44. Hence, as compared with the exposed area not shaded by the soldering layer 49, the surface of the vicinity of the border is modified while modified thickness is thin.

After the surface of the organic insulation film 47 is modified by the above-mentioned plasma process, as shown in FIG. 12-(i), the soldering layer 49 is formed in a substantially spherical shape by reflow heating.

In other words, a spherical-shaped soldering bump (soldering ball) 49 is formed on the electrode layer 43 of the semiconductor substrate 41 by reflow heating.

The diameter of the spherical soldering bump (soldering ball) 49 formed in the substantially spherical shape by reflow heating is smaller than the diameter of the soldering layer 49 formed by the electrolytic plating process shown in FIG. 11-(e). Therefore, a part not modified by the plasma process shown in FIG. 12-(h) of the organic insulation film 44 is exposed.

Next, as shown in FIG. 12-(i), the surface of the organic insulation film 44 is etched by the dry etching process.

As well as the first embodiment of the present invention, the radio frequency (RF) plasma etching using mixed gas of oxygen ($O_2$) and carbon tetrafluoride ($CF_4$) is applied as this dry etching process. In this case, while the flow amount of the gas may be substantially same as the flow amount of gas used in the first embodiment of the present invention (that is, the flow amount of oxygen ($O_2$) is approximately 400 sccm and the flow amount of carbon tetrafluoride ($CF_4$) is approximately 100 sccm), the power of the radio frequency (RF) plasma is greater than the plasma power used in the first embodiment of the present invention and is equal to approximately 400 W. Under the above-mentioned conditions, the dry etching process is performed for approximately 30 seconds, for example.

The flow amount of the mixed gas is not limited to the above-mentioned example. For example, the mixture ratio of the two gases may be the same while the flow amounts of both gases are changed. In addition, the material for the gas is not limited to the above-mentioned example. For example, trifluoromethane ($CHF_3$) gas may be used.

FIG. 13 is an expanded view of a part surrounded by a broken line in FIG. 12.

In FIG. 13-(a), a part indicated by a broken line A is a surface area of the organic insulation film 44 that is modified by the plasma process using the nitrogen gas ($N_2$) in the process shown in FIG. 12-(h) so that the surface bonding becomes strong (tight).

In FIG. 13-(a), a part indicated by a broken line B is a surface area of the organic insulation film 44 that is not modified because the surface is shaded by the soldering layer 49 and is not influenced by the plasma so that the surface remains soft.

In FIG. 13-(a), a part indicated by a broken line C is a surface area of the organic insulation film 44 that is in the vicinity of a border of an exposed area not shaded by the soldering layer 49 and the area shade by the soldering layer 49. As compared with the exposed area not shaded by the soldering layer 49, this surface in the vicinity of the border is modified and becomes strong (tight) due to the influence of the nitrogen gas at the time of the plasma process while the thickness of the modified part is made thin.

Because of this, the etching rate of the radio frequency (RF) plasma etching using the mixed gas of oxygen ($O_2$) and carbon tetrafluoride ($CF_4$) is faster to slower in the order of the part indicated by the broken line B, the broken line C, and the broken line A.

Accordingly, as shown in FIG. 13-(b), the part indicated by the broken line B, namely an area where no influence of the plasma is given so that no modification is made and the area remains soft, has an etched rate greater than the part indicated by the broken line A, namely an area where influence of the plasma is given so that the modification is made and the area becomes tight. Therefore the part indicated by the broken line B is deeply etched.

Figure 14:
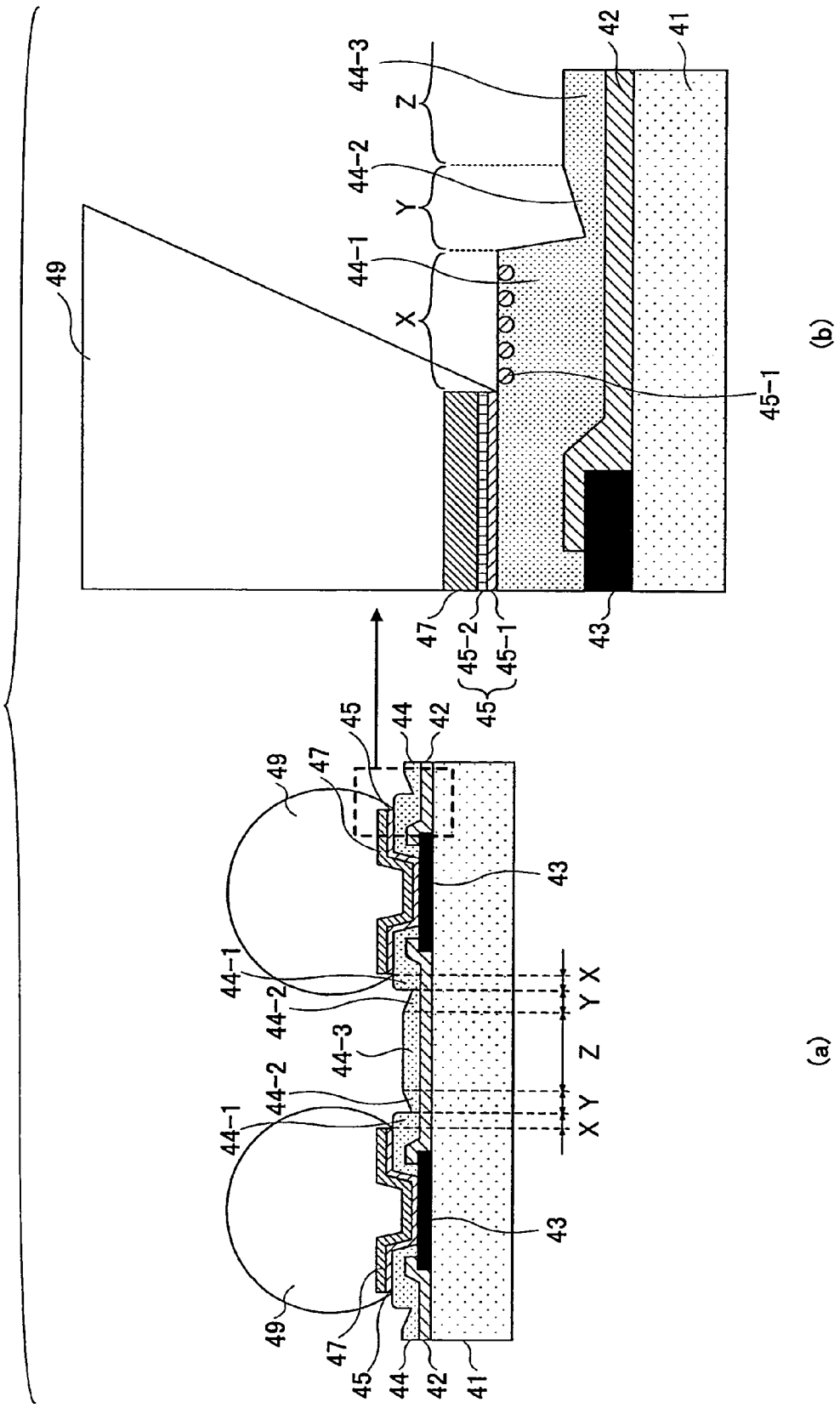
FIG. 14 is a view of the bump formed on the semiconductor element of the semiconductor device manufactured by the manufacturing method of the second embodiment of the present invention.

FIG. 14 is a view of the bump formed by the above-discussed processes. FIG. 14-(b) is an expanded view of a part surrounded by a dotted line in FIG. 14-(a).

Referring to FIG. 14, the titanium film 45-1, the copper film 45-2 and the barrier metal layer 47 are stacked on the aluminum electrode layer (electrode pad) 43 and the organic insulation film 44 in this order. The bump 49 as the projection electrode for outside connection is formed on the barrier metal layer 47. The organic insulation film 44 continuously covers the surface of the semiconductor element existing between the neighboring electrode layers 43.

In the following explanation, an organic insulation film on which the power supply layer 45 is not provided and in an area "X" inside of a point of the external periphery in a direction parallel to the main surface of the semiconductor substrate 41, is called a bump-vicinity organic insulation film 44-1.

An organic insulation film formed in an area Y being deeply etched by the dry etching shown in FIG. 12-(j), as shown in FIG. 13-(b), ("a first area" in claims) is called a first etched organic insulation film 44-2.

An organic insulation film formed in an area Z outside of the area Y ("a second area" in claims) is called a second etched organic insulation film 44-3.

Thickness of the bump-vicinity organic insulation film 44-1, that is, the distance between the surface of the bump-vicinity organic insulation film 44-1 and a surface of the inorganic insulation film 42 coming in contact with the bump-vicinity organic insulation film 44-1, is substantially equal to the distance between the surface of the organic insulation film 44 when covering the inorganic insulation film 42 as shown in FIG. 11-(a) and the surface of the inorganic insulation film 42 coming in contact with the bump-vicinity organic insulation film 44-1.

On the other hand, approximately 600 nm of the first etched organic insulation film 44-2 is dry etched by the etching process discussed with reference to FIG. 12-(j) and approximately 50 through 200 nm of the second etched organic insulation film 44-3 is dry etched by the etching process discussed with reference to FIG. 12-(j), so that the first etched organic insulation film 44-2 is thinner than the second etched organic insulation film 44-3.

Therefore, while the part being thinner than the bump-vicinity organic insulation film 44-1 is formed by the dry etching process shown in FIG. 12-(j), the bump-vicinity organic insulation film 44-1 being thicker than the part is provided in the periphery of the bump 39. Therefore, even if the stress is concentrated on the bump-vicinity organic insulation film 44-1 when the semiconductor element is mounted on a wiring board 11 (See FIG. 3), it is possible to prevent the generation of the cracks at this part.

In addition, the surface roughness of the second etched organic insulation film 44-3 by the dry etching process shown in FIG. 12-(j) is approximately 100 nm as a maximum, which is equal to or approximately five times the surface roughness of the bump-vicinity organic insulation film 44-1

Therefore, it is possible to obtain sufficient adhesion between the underfill 13 and the organic insulation film 44 so that the reliability of the connection between the semiconductor element 10 and the printed board 11 after the semiconductor element 10 is mounted on the printed board 11 can be secured.

In a process shown in FIG. 11-(b), the titanium (Ti) film 45-1 (See FIG. 14) is formed on the surface of the organic insulation protection film 44 by sputtering so that the titanium (Ti) is embedded in and remains in the surface as a metal residue. While approximately 10 atm %, as a maximum, of the metal residue remain in the bump-vicinity organic insulation film 44-1, almost all of the metal residue in the etched organic insulation film 44-2 is removed by the process shown in FIG. 12-(j) and therefore approximately 0.1 atm % or less of the metal residue remains embedded in the etched organic insulation film 44-2.

Thus, in the etched organic insulation film 44-2, almost all of the metal residue is removed. Hence, it is possible to obtain sufficient adhesion between the underfill 13 and the organic insulation film 44 so that the reliability of the connection between the semiconductor element 10 and the printed board 11 after the semiconductor element 10 is mounted on the printed board 11 can be secured.

An inventor of the present invention took a picture of the bump structure of the second embodiment of the present invention by using a Scanning Electron Microscope (SEM). The picture is shown in FIG. 15.

Figure 15:
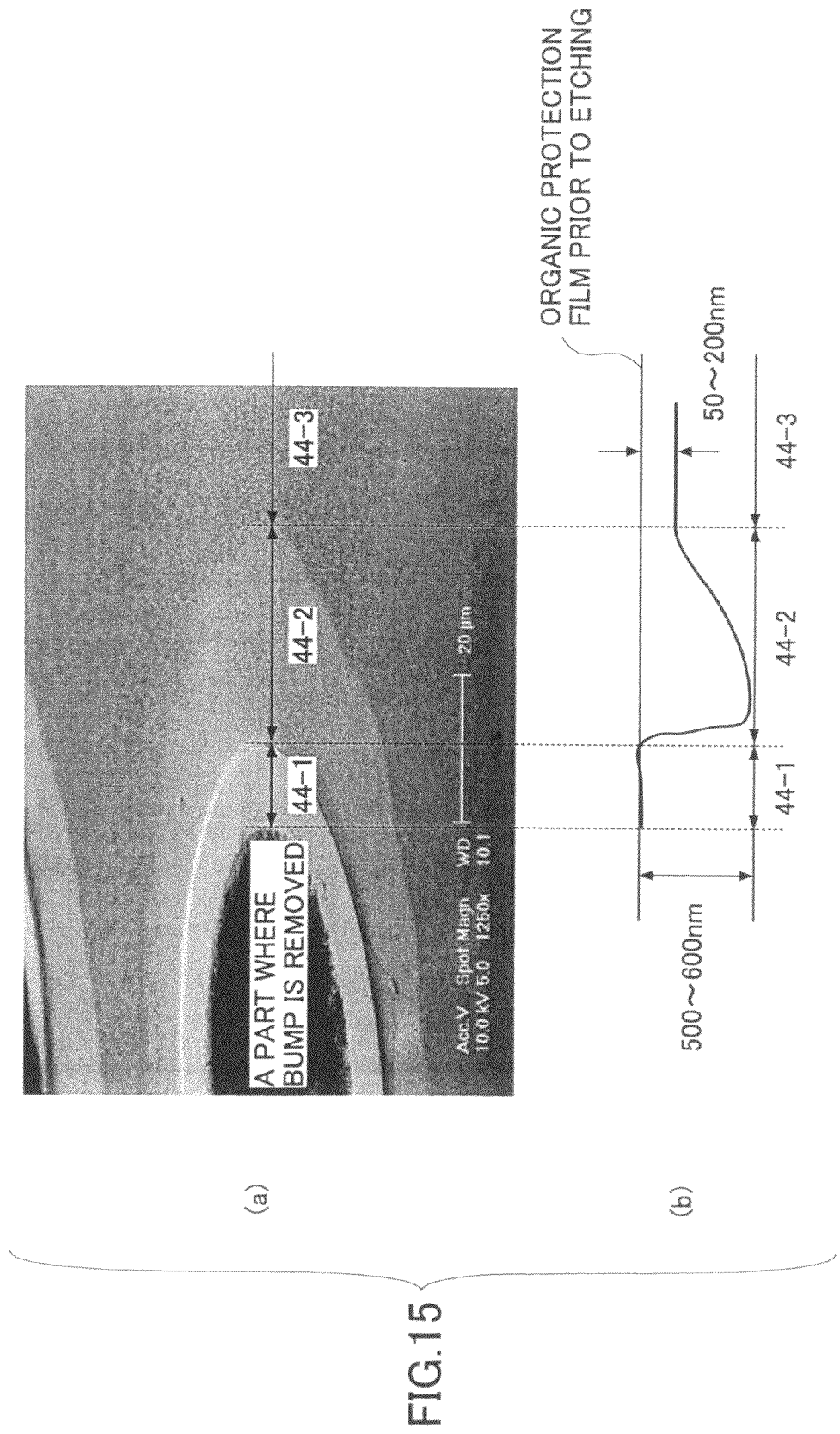
FIG. 15 is a view showing a picture of the bump formed on the semiconductor element of the semiconductor device manufactured by the manufacturing method of the second embodiment of the present invention, taken by a Scanning Electron Microscope (SEM).

FIG. 15-(a) is a picture where the bump is removed from the bump structure of the second embodiment of the present invention. FIG. 15-(b) is a cross-sectional structure of FIG. 15-(a). Referring to FIG. 15-(a), it is found that the bump-vicinity organic insulation film 44-1, the first etched organic insulation film 44-2, and the second etched organic insulation film 44-3 are formed, in this order, in the periphery of a part where the soldering bump 49 is provided.

The inventor of the present invention also found that the surface roughness of the bump-vicinity organic insulation film 44-1 is equal to or greater than 1.5 nm and equal to or less than 3.7 nm, the surface roughness of the first etched organic insulation film 44-2 is equal to or greater than 9.8 nm and equal to or less than 16.2 nm, and the surface roughness of the second etched organic insulation film 44-3 is equal to or greater than 31.5 nm and equal to or less than 48.3 nm. Thus, it is found that the surface roughness of the second etched organic insulation film 44-3 is sufficiently greater than the surface roughness of the bump-vicinity organic insulation film 44-1.

Furthermore, referring to FIG. 15-(b), the inventor of the present invention found that while no influence by the etching is given to the surface of the bump-vicinity organic insulation film 44-1, approximately 500 through 600 nm of the first etched organic insulation film 44-2 is etched and approximately 50 through 200 nm of the second etched organic insulation film 44-3 is etched. Thus, it is found that the first etched organic insulation film 44-2 is thinner than the second etched organic insulation film 44-3, and the second etched organic insulation film 44-3 is thinner than the bump-vicinity organic insulation film 44-1.

According to the second embodiment of the present invention, the etched organic insulation films 44-2 and 44-3, each of whose surface roughness is greater than the surface roughness of the bump-vicinity organic insulation film 44-1, are formed by the dry etching process shown in FIG. 12-(j), and the metal residue embedded in the surfaces of the etched organic insulation films 44-2 and 44-3 is removed by the process shown in FIG. 11-(b).

In addition, the surface of the organic insulation film 44 is modified by applying the dry etching process shown in FIG. 12-(h), and then the dry etching process shown in FIG. 12-(j) is applied. Therefore, a part of the organic insulation film 44 is deeply etched so that the first etched organic protection film 44-2 is made.

On the other hand, the thickness of the bump-vicinity organic insulation film 44-1 is not changed from the thickness of the organic insulation film 44 when the organic insulation film 44 is formed on the inorganic insulation film 42 as shown in FIG. 11-(a). Therefore, the strength in the vicinity of the bump 49 is not reduced.

Hence, sufficient adhesion between the organic insulation film 44 and the underfill 13 can be obtained and concentration of the stress in the organic insulation film 44-1 in the vicinity of the bump 49 can be avoided, so that reliability of connection between the semiconductor element and a printed circuit board where the semiconductor element is mounted can be improved.

Figure 7:
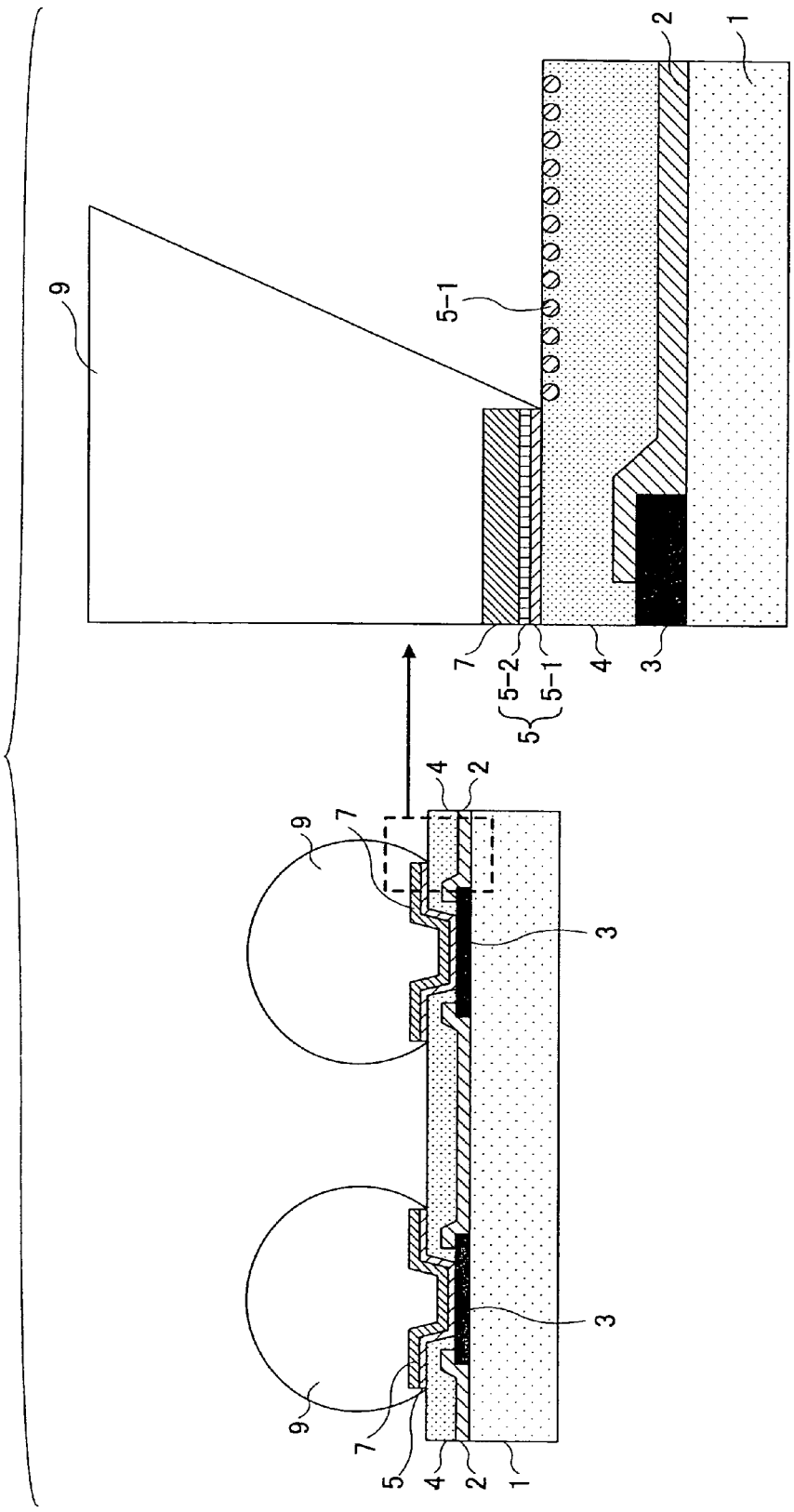
FIG. 7 is a view of the bump formed on the semiconductor element of the semiconductor device manufactured by the related art manufacturing method.

According to a Pressure Cooker Test (PCT) under the conditions that the temperature is 121° C. and the moisture is 85%, while the organic insulation film is removed from the underfill after 168 hours have passed in the semiconductor device having a related art structure shown in FIG. 7, the adhesion between the organic insulation film and the underfill is maintained even after 168 hours are passed in the semiconductor device of the present invention.

In addition, it is found that, according to the Pressure Cooker Test (PCT) after the dry etching process is applied so that the metal residue in the surface of the organic insulation film is equal to or less than approximately 0.1 atm %, the adhesion between the organic insulation film and the underfill is maintained even after 264 hours have passed.

Furthermore, in a case where these are combined, that is, in a case where the surface roughness of the organic insulation film is made the same as in each of the above-discussed embodiments and the dry etching process is applied so that the metal residue in the surface of the organic insulation film is equal to or less than approximately 0.1 atm %, and then the Pressure Cooker Test is implemented, it is found that the adhesion between the organic insulation film and the underfill is maintained even after 504 hours have passed.

Therefore, according to the present invention, approximately three times or more reliability as compared to the related art is obtained. Hence, it is possible to provide a semiconductor device having a good adhesion after the semiconductor element is mounted on the printed board.

Thus, according to the embodiments of the present invention, without changing the thickness of the organic insulation film in the vicinity of the bump, by the dry etching process, the surface roughness of the organic insulation film situated outside of the organic insulation film in the vicinity of the bump can be made greater than the surface roughness of the organic insulation film in the vicinity of the bump and the metal residue embedded in the surface can be removed.

Also, according to the embodiments of the present invention, sufficient adhesion between the organic insulation film of the semiconductor element and the underfill can be obtained and concentration of the stress in the organic insulation film in the vicinity of the bump can be avoided and therefore the strength is maintained, so that reliability of the connection between the semiconductor element and a printed circuit board where the semiconductor element is mounted can be improved.

The present invention is not limited to these embodiments, but variations and modifications may be made without departing from the scope of the present invention.

This patent application is based on Japanese Priority Patent Application No. 2005-367210 filed on Dec. 20, 2005, the entire contents of which are hereby incorporated by reference.

What is claimed is:

1. A manufacturing method of a semiconductor device, comprising:
   forming a plurality of electrode pads on a semiconductor;
   forming an organic insulation protection film to continuously cover a gap between the neighboring electrode pads so that substantially centers of the electrode pads are exposed;
   forming a solder layer on the electrode pads;
   applying a first dry etching process to the surface of the organic protection film excluding a periphery of the solder layer on the electrode pads;
   applying a reflow process to the solder layer on the electrode pads after applying the first dry etching process so that a projection electrode is formed on each of the electrode pads; and
   applying a second dry etching process to the surface of the organic insulation protection film excluding the periphery of the projection electrode.

2. The manufacturing method of the semiconductor device as claimed in claim 1,
   wherein each of the first and second dry etching processes is a radio frequency (RF) dry etching.

3. The manufacturing method of the semiconductor device as claimed in claim 1,
   wherein gas used for the second dry etching process is mixed gas of oxygen gas, carbon tetrafluoride ($CF_4$) or trifluoromethane ($CHF_3$).

4. The manufacturing method of the semiconductor device as claimed in claim 1,
   wherein nitrogen gas or argon gas is used for the first dry etching process.

5. The manufacturing method of the semiconductor device as claimed in claim 1, wherein a thickness of the organic insulation protection film excluding the periphery of the projection electrode is smaller than a thickness of the organic insulation protection film in the periphery of projection electrode.

* * * * *